US009543122B2

(12) United States Patent
Bhutta

(10) Patent No.: US 9,543,122 B2
(45) Date of Patent: *Jan. 10, 2017

(54) METHOD FOR CONTROLLING AN RF GENERATOR

(71) Applicant: Reno Technologies, Inc., Wilmington, DE (US)

(72) Inventor: Imran Ahmed Bhutta, Moorestown, NJ (US)

(73) Assignee: RENO TECHNOLOGIES, INC.

( * ) Notice: Subject to any disclaimer, the term of this patent is extended or adjusted under 35 U.S.C. 154(b) by 0 days.

This patent is subject to a terminal disclaimer.

(21) Appl. No.: 15/061,020

(22) Filed: Mar. 4, 2016

(65) Prior Publication Data

US 2016/0322203 A1    Nov. 3, 2016

Related U.S. Application Data

(63) Continuation of application No. 14/700,209, filed on Apr. 30, 2015, now Pat. No. 9,345,122.

(60) Provisional application No. 61/987,718, filed on May 2, 2014.

(51) Int. Cl.
| | | |
|---|---|---|
| H01J 7/24 | (2006.01) |
| H05H 1/46 | (2006.01) |
| H01L 21/02 | (2006.01) |
| H01J 37/32 | (2006.01) |
| H01L 21/311 | (2006.01) |

(Continued)

(52) U.S. Cl.
CPC .... *H01J 37/32174* (2013.01); *H01J 37/32146* (2013.01); *H01L 21/02274* (2013.01); *H01L 21/31116* (2013.01); *H03F 1/0233* (2013.01); *H03F 3/195* (2013.01); *H05H 1/46* (2013.01); *H01J 2237/332* (2013.01); *H01J 2237/334* (2013.01); *H03F 2200/387* (2013.01); *H03F 2200/451* (2013.01); *H03F 2200/462* (2013.01); *H03F 2200/471* (2013.01); *H05H 2001/4682* (2013.01)

(58) Field of Classification Search
CPC ........ H05L 1/46; H01L 21/02274; H01L 7/14; H05H 2001/4645; H05H 2001/4682
USPC ....... 315/111.21, 111.51, 17.3; 330/130–136
See application file for complete search history.

(56) References Cited

U.S. PATENT DOCUMENTS

| | | |
|---|---|---|
| 3,641,451 A | 2/1972 | Hollingsworth et al. |
| 4,375,051 A | 2/1983 | Theall |
| 4,547,746 A | 10/1985 | Erickson et al. |

(Continued)

FOREIGN PATENT DOCUMENTS

| | | |
|---|---|---|
| WO | 2004054096 | 6/2004 |
| WO | 2012076522 | 6/2012 |

*Primary Examiner* — Dinh T Le
(74) *Attorney, Agent, or Firm* — The Belles Group, P.C.

(57) ABSTRACT

In one embodiment, an RF generator includes an RF amplifier that includes an RF input, a DC input, and an RF output, the RF amplifier configured to receive at the RF input an RF signal from an RF source; receive at the DC input a DC voltage from a DC source; and provide an output power at the RF output; and a control unit operably coupled to the DC source and the RF source, the control unit configured to receive a power setpoint for the RF output; determine a power dissipation at the RF generator; and alter the DC voltage to a final DC voltage that decreases the power dissipation at the RF generator while enabling the output power at the RF output to be substantially equal to the power setpoint.

20 Claims, 4 Drawing Sheets

(51) Int. Cl.
*H03F 1/02* (2006.01)
*H03F 3/195* (2006.01)

(56) References Cited

U.S. PATENT DOCUMENTS

| | | | |
|---|---|---|---|
| 6,069,525 | A | 5/2000 | Sevic et al. |
| 6,107,872 | A * | 8/2000 | Schoepe ............... H03F 1/0222 327/551 |
| 6,617,920 | B2 | 9/2003 | Staudinger et al. |
| 7,288,987 | B2 | 10/2007 | Carichner et al. |
| 7,358,802 | B2 | 4/2008 | Chen |
| 7,397,676 | B2 | 7/2008 | Lincoln et al. |
| 7,570,931 | B2 | 8/2009 | McCallister et al. |
| 7,917,105 | B2 * | 3/2011 | Drogi ................... H03F 1/0205 455/126 |
| 8,018,277 | B2 | 9/2011 | Drogi et al. |
| RE42,917 | E | 11/2011 | Hauer et al. |
| 8,452,243 | B2 | 5/2013 | Prikhodko et al. |
| 8,912,771 | B2 | 12/2014 | Humphrey et al. |
| 2008/0003962 | A1 | 1/2008 | Ngai |
| 2009/0289719 | A1 | 11/2009 | Bezooijen et al. |
| 2012/0067873 | A1 | 3/2012 | Mihara et al. |

* cited by examiner

METHOD FOR CONTROLLING AN RF GENERATOR

CROSS REFERENCE TO RELATED APPLICATIONS

The present application is a continuation of U.S. patent application Ser. No. 14/700,209, filed Apr. 30, 2015, which claims the benefit of U.S. Provisional Patent Application Ser. No. 61/987,718, filed May 2, 2014, the disclosures of which are incorporated herein by reference in their entirety.

FIELD OF THE INVENTION

The field of the present invention relates to systems and methods for controlling an RF generator, including systems for controlling an RF generator used in semiconductor plasma processing.

BACKGROUND OF THE INVENTION

Radio frequency ("RF") generators are used in many applications, including telecommunication, broadcast, and industrial processing. An RF generator can be a closed loop system comprising of an RF amplifier, a DC power source, and associated closed loop circuitry.

A block diagram of a typical RF amplifier is shown in FIG. 1. The RF amplifier can receive an RF signal at its RF input and a DC voltage at its DC input. Further, the RF amplifier can output an RF power at its RF output. The RF amplifier uses the RF signal to modulate the power received at the DC input to provide an RF power that is higher than the power at the RF input.

The efficiency of the RF amplifier is dependent upon several factors, including the value of the load connected to its output. As that load changes, so does the efficiency of the RF amplifier. The power dissipation of the RF amplifier (sometimes referred to herein as "PDISS") is generally understood as the difference between the RF output power and the DC input power or, more specifically, the power at the RF output minus the power reflected back to the RF amplified and the power at the DC input.

This power loss ($P_{dissipated}$) is dissipated as heat among the different components of the RF amplifier. Any heat generated in the components has a direct impact on the reliability of the components. As a result, in many applications, the RF amplifier is provided with protection schemes to protect the RF amplifier under conditions such as high dissipation. In most cases, the protection schemes are designed to limit the RF output power and, as a result, limit the DC input power.

While the protection schemes built into RF generators allow the RF generator to protect itself, the protection schemes also limit the RF output power. Limited RF output power can be problematic for systems that utilize RF generators, such as systems providing semiconductor plasma processing. In such a system, an RF generator is supplying power to enable semiconductor processing. Plasma processing involves energizing a gas mixture by imparting energy to the gas molecules by introducing RF energy into the gas mixture. This gas mixture is typically contained in a vacuum chamber (the plasma chamber), and the RF energy is typically introduced into the plasma chamber through electrodes. If the RF output power is decreased by the generator's protection schemes, the power delivered to the plasma chamber is reduced, thereby reducing the process yield for the semiconductor processing system. Further, certain plasma conditions may regularly present load conditions to the RF generator such that the RF amplifier's protection schemes are regularly enabled, thereby affecting the ability of the semiconductor to be processed.

Thus, there is need for an RF generator and a method for controlling an RF generator that enables the RF generator to operate more efficiently and/or provide sufficient RF output power.

SUMMARY OF THE INVENTION

The present invention is directed toward systems and methods for controlling an RF generator. Such systems and methods can be used in semiconductor processing, as well as in other applications.

In a first aspect, an RF generator includes an RF amplifier comprising an RF input, a DC input, and an RF output, the RF amplifier configured to receive at the RF input an RF signal from an RF source; receive at the DC input a DC voltage from a DC source; and provide an output power at the RF output; and a control unit operably coupled to the DC source and the RF source, the control unit configured to receive a power setpoint for the RF output; determine a power dissipation at the RF generator; and alter the DC voltage to a final DC voltage that decreases the power dissipation at the RF generator while enabling the output power at the RF output to be substantially equal to the power setpoint.

In a second aspect, a method of controlling an RF generator includes (a) providing an RF amplifier, the RF amplifier comprising a DC input, an RF input, and an RF output, the RF amplifier configured to provide an output power at the RF output; (b) receiving an RF signal to the RF input of the RF amplifier; (c) receiving a DC voltage to the DC input of the RF amplifier; (d) receiving a power setpoint for the RF output; (e) determining a power dissipation at the RF generator; and (f) altering the DC voltage to a final DC voltage that decreases the power dissipation at the RF generator while enabling the output power at the RF output to be substantially equal to the power setpoint.

In a third aspect, a method of fabricating a semiconductor includes placing a substrate in a plasma chamber configured to deposit a material layer onto the substrate or etch a material layer from the substrate; and energizing plasma within the plasma chamber by coupling RF power from an RF source into the plasma chamber to perform a deposition or etching; wherein the RF power is provided by an RF generator, the RF generator controlled by (a) providing an RF amplifier, the RF amplifier comprising a DC input, an RF input, and an RF output, the RF amplifier configured to provide an output power at the RF output; (b) providing an RF signal to the RF input of the RF amplifier; (c) providing a DC voltage to the DC input of the RF amplifier; (d) receiving a power setpoint for the RF output; (e) determining a power dissipation at the RF generator; and (f) altering the DC voltage to a final DC voltage that decreases the power dissipation at the RF generator while enabling the output power at the RF output to be substantially equal to the power setpoint.

Accordingly, an improved RF generator, along with systems and methods incorporating same, is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

The method described herein controls an RF generator by adjusting the DC voltage (sometimes referred to as the DC rail) presented to the RF amplifier such that the RF amplifier can operate in a high efficiency mode. A control algorithm can enable the RF output power to reach a desired power (referred to herein as the power setpoint) and can alter the DC voltage to provide a comparable output power while minimizing power dissipation. This method will be described in greater detail below.

Figure 1:
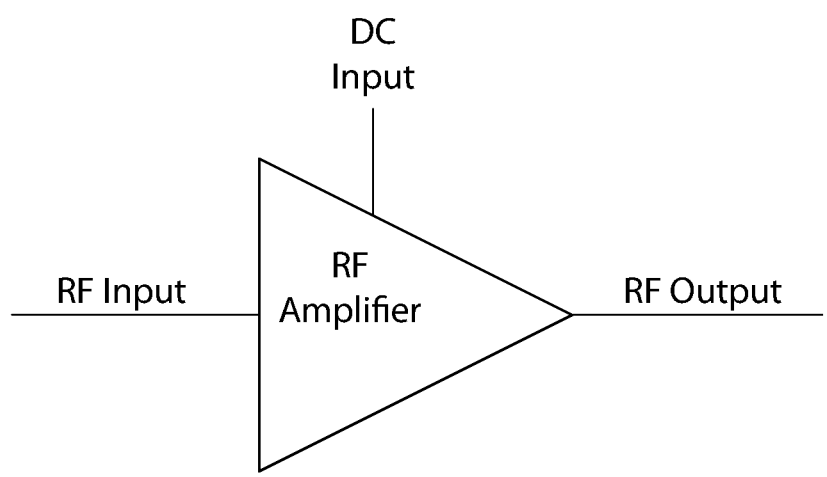
FIG. 1 is a block diagram of a prior art RF amplifier.
Figure 2:
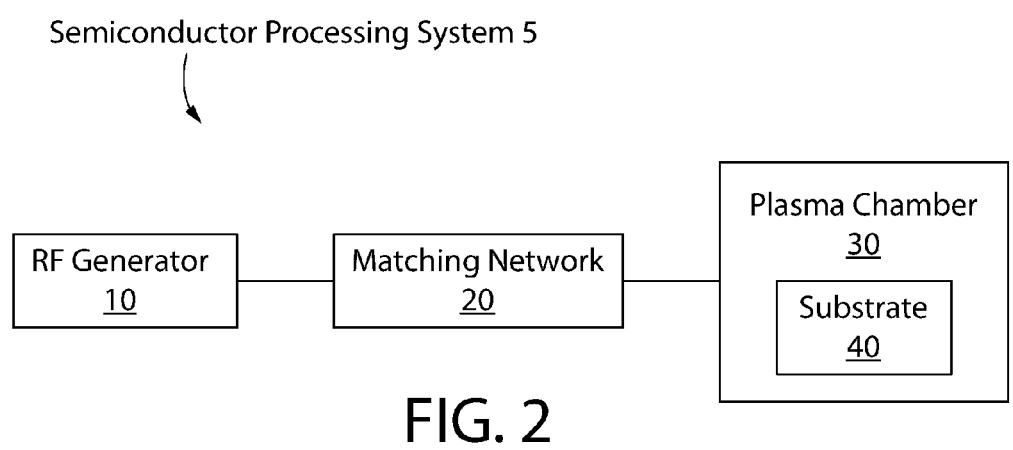
FIG. 2 is a block diagram of an embodiment of a semiconductor processing system.

Referring to FIG. 2, a semiconductor device processing system 5 utilizing an RF generator 10 is shown. The system 5 includes an RF generator 10, a matching network 20, and a plasma chamber 30. The semiconductor device can be a microprocessor, a memory chip, or other type of integrated circuit or device. A substrate 40 can be placed in the plasma chamber 30, where the plasma chamber 30 is configured to deposit a material layer onto the substrate 40 or etch a material layer from the substrate 40. Plasma processing involves energizing a gas mixture by imparting energy to the gas molecules by introducing RF energy into the gas mixture. This gas mixture is typically contained in a vacuum chamber (the plasma chamber 30), and the RF energy is typically introduced into the plasma chamber 30 through electrodes. Thus, the plasma can be energized by coupling RF power from an RF source 105 into the plasma chamber 30 to perform deposition or etching.

In a typical plasma process, the RF generator 10 generates power at a radio frequency—which is typically within the range of 3 kHz and 300 GHz—and this power is transmitted through RF cables and networks to the plasma chamber 30. In order to provide efficient transfer of power from the RF generator 10 to the plasma chamber 30, an intermediary circuit is used to match the fixed impedance of the RF generator 10 with the variable impedance of the plasma chamber 30. Such an intermediary circuit is commonly referred to as an RF impedance matching network, or more simply as an RF matching network. The purpose of the RF matching network 20 is to transform the variable plasma impedance to a value that more closely matches the fixed impedance of the RF generator 10. Commonly owned U.S. patent application Ser. No. 14/669,568, the disclosure of which is incorporated herein by reference in its entirety, provides an example of such a matching network.

The semiconductor device processing system 5 is an example of a system that can utilize the RF generator 10. The RF generator 10, however, is not so limited, as it could be used in a variety of other applications that require RF energy. Such systems can include systems for telecommunication, broadcast, and industrial processing.

Figure 3:
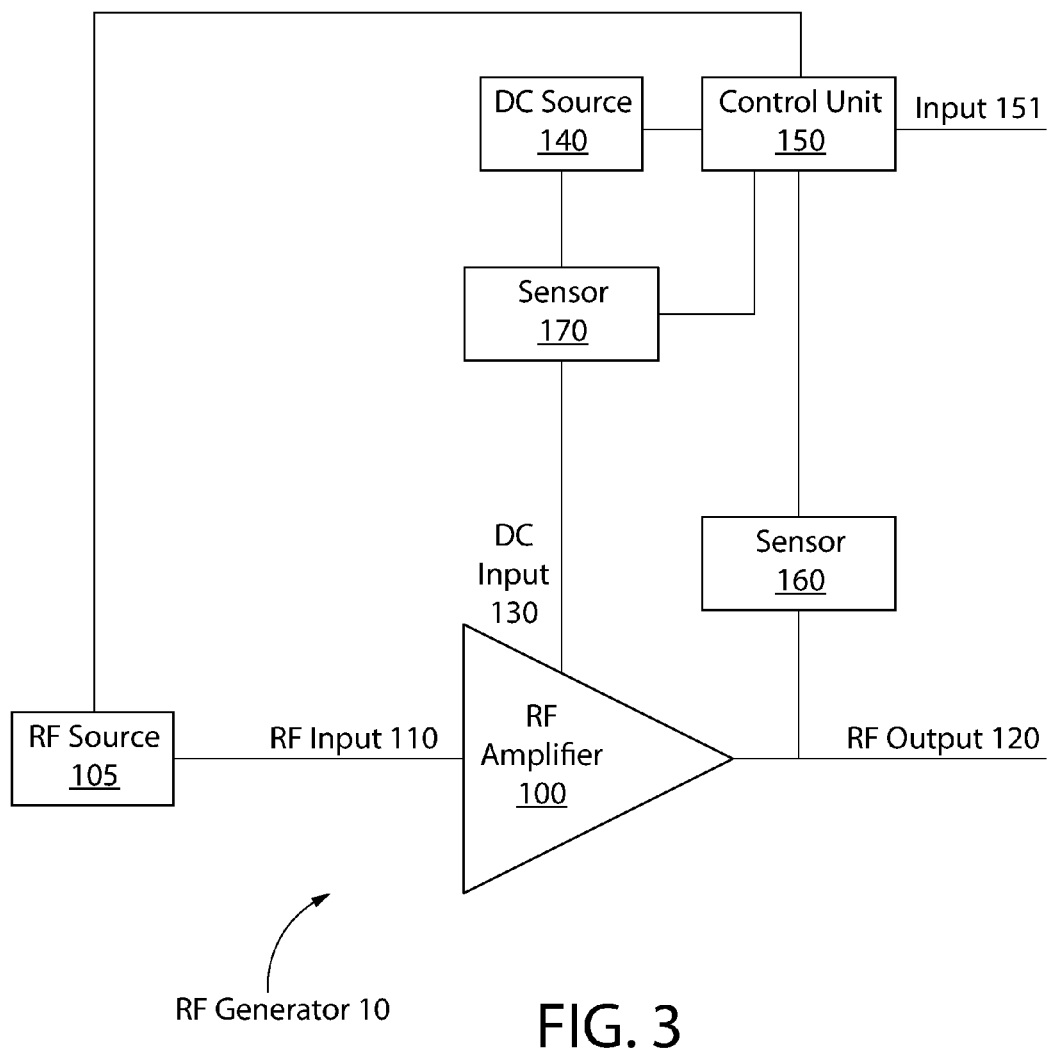
FIG. 3 is a block diagram of an embodiment of an RF generator.

Referring now to FIG. 3, a block diagram of an embodiment of an RF generator 10 is shown. The RF generator 10 includes an RF amplifier 100 having an RF input 110, a DC input 130, and an RF output 120. An RF source 105 provides an RF signal to the RF amplifier 100 at the RF input 110. A DC source 140 provides a DC voltage to the RF amplifier 100 at the DC input 130. The RF signal can modulate the power received at the DC input 130 to provide an RF output power at the RF output 120 that is higher than the power at the RF input 110. The RF source can be any device capable of providing a sufficient RF signal for operation of an RF generator, and the DC source can be any device capable of providing a sufficient DC signal for operation of an RF generator.

A sensor 160 is connected to the RF output 120. The sensor 160 is configured to detect an RF output parameter. The RF output parameter can be any parameter (or parameters) measurable at the RF output 120, including a voltage, a current, and a phase angle between the voltage and current. In the exemplified embodiment, the sensor 160 detects the voltage, the current, and the phase angle between the voltage and the current at the RF output 120.

Another sensor 170 is connected to the DC source 140. This sensor 170 is configured to detect a DC input parameter. The DC input parameter can be any parameter (or parameters) measurable at the DC input 130, including a voltage, a current, and a phase angle between the voltage and current.

The RF generator 10 further includes a control unit 150 that can be coupled to the RF source 105, the DC source 140, and the sensors 160, 170 of the RF generator 10. The control unit 150 can provide several functions for the RF generator 10. The control unit 150 can receive instructions from a user or a system at an input 151. The control unit 150 can receive the RF output parameter from sensor 160 and determine the RF output power. Further, the control unit 150 can receive the DC input parameter from sensor 170 and determine the DC input power.

Further, the control unit 150 can generate and transmit instructions to other components of the system 5. The control unit 150 can send instructions to the DC source 140 to alter the DC voltage provided to the RF amplifier 100. Further, the control unit 150 can send instructions to the RF source 105 to alter the RF signal provided to the RF amplifier 100. Instruction to the RF source 105 can be sent as a PDAC signal. The PDAC signal (or "PDAC") can be any signal sent by the control unit 150 to the RF source 105 to alter the RF signal output of the RF source 105. In the preferred embodiment, the PDAC is a DC signal that alters the amplitude of the RF signal. The PDAC can increase or decrease how hard the RF amplifier 100 is working to increase the RF output power. The control unit 150 can be programmed to know the proper PDAC value to send to produce the desired result for the RF amplifier 100.

The control unit 150 can be programmed to carry out a control algorithm for determining the instructions to send to the DC source 140 and/or RF source 105. This algorithm will be discussed in further detail below.

The control unit 150 is configured with an appropriate processor and/or signal generating circuitry to provide signals for controlling components of the RF generator 10, such as the DC source 140 and RF source 105. In the exemplified embodiment, the control circuit 150 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable the RF generator 10 to operate as described herein.

Figure 4:
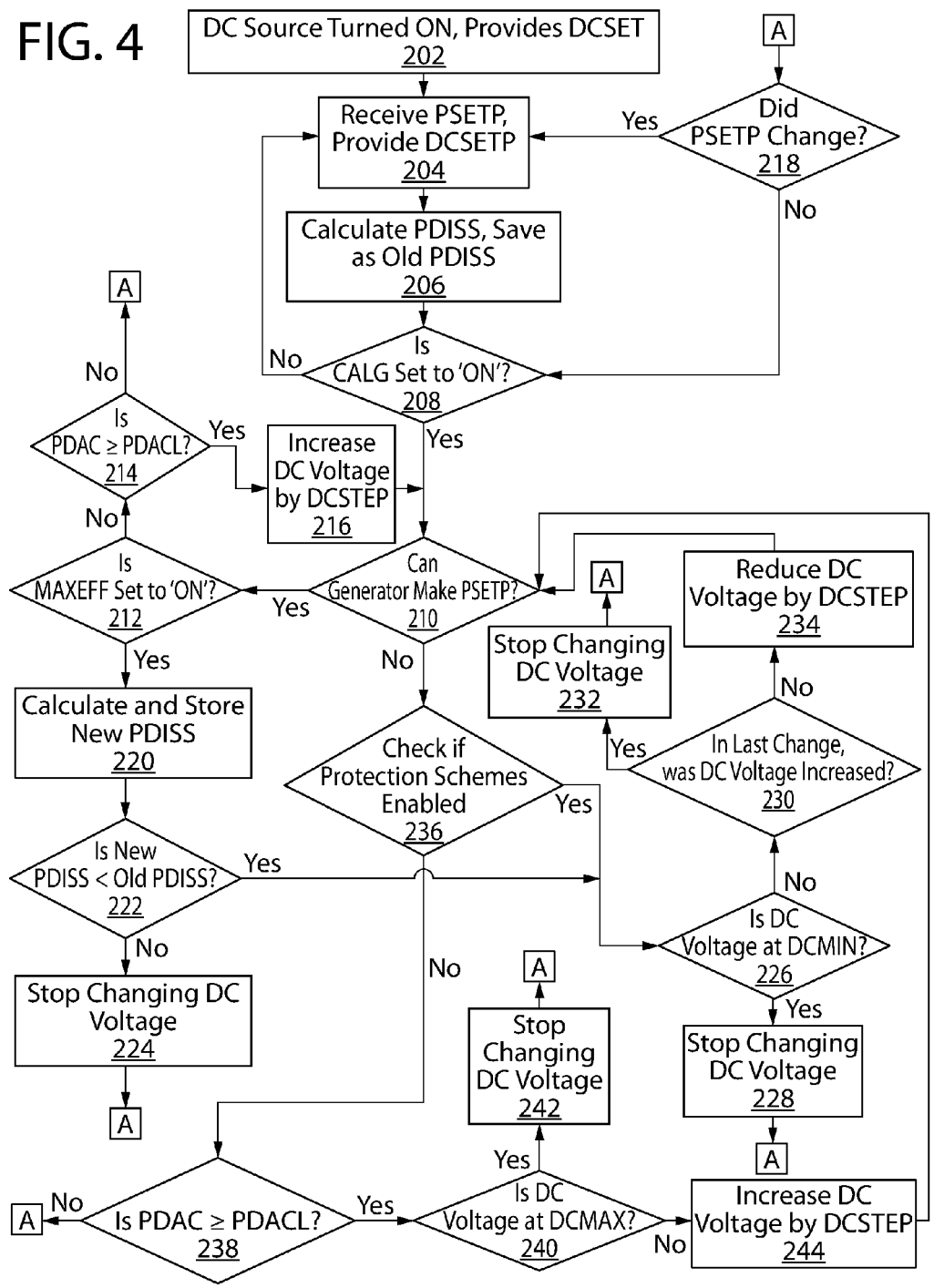
FIG. 4 is a flow chart of an embodiment of a control algorithm for an RF generator.

Referring now to FIG. 4, a flow chart of an embodiment of a control algorithm for an RF generator 10 is shown. It should be noted at the outset that the exemplified control algorithm (sometimes referred to herein simply as the "process") contains several routines, some of which can run independently of other routines. For example, the steps for ensuring maximum efficiency can be run independently of the steps for achieving an RF output power corresponding to the setpoint. In the exemplified embodiment, the control algorithm includes steps for achieving the power setpoint and steps for ensuring maximum efficiency at that setpoint. In alternative embodiments, the achievement of the power setpoint can be assumed and the control algorithm can refer simply to the steps for ensuring maximum efficiency at that setpoint. In yet other embodiments, the control algorithm can simply provide a process for achievement of the power setpoint. The exemplified embodiment is just one approach for carrying out the invention.

Table 1 below provides certain abbreviations used in the flow chart.

TABLE 1

| Abbreviation | Meaning |
| --- | --- |
| CALG | Control algorithm |
| DCSET | Startup DC setpoint |
| DCSETP | DC setpoint based on power setpoint (SETP) |
| PSETP | Power setpoint |
| DCMAX | Maximum DC voltage provided by DC source |
| DCMIN | Minimum DC voltage provided by DC source |
| DCSTEP | Predetermined amount by which DC voltage is increased or decreased |
| PDAC | Power signal to the RF source |
| PDACL | Limit on PDAC (maximum PDAC) |
| MAXEFF | Maximum efficiency mode |
| PDISS | Power dissipation of the amplifier |

The exemplified process for controlling the RF generator 10 allows the user to select whether to operate the RF generator 10 in maximum efficiency (MAXEFF) mode. The maximum efficiency option can be controlled by the user at the control unit 150 by a switch or by any other known method for enabling a process. In alternative embodiments, the maximum efficiency steps can always be enabled when the DC source 140 is turned ON.

The process also allows a user to set a maximum DC voltage provided by DC source (DCMAX), a minimum DC voltage provided by DC source 140, and a startup DC setpoint (DCSET). The startup DC setpoint (DCSET) is the initial DC voltage provided by the DC source 140 when the DC source 140 is turned ON. In alternative embodiments, one or more of the DCMAX, DCMIN, and DCSET can be fixed values, or can be determined by a program.

The exemplified process for controlling the RF generator 10 begins by the DC source 140 being turned ON (step 202). In the exemplified embodiment, the DC source 140 receives power from an AC power source and a switch enables a user to turn the DC source 140 ON. When the DC source 140 is initially turned ON, it provides the startup DC setpoint (DCSET). In other embodiments, the step of providing a startup DC setpoint can be omitted.

Next, a desired power at the RF output (PSETP) is received and, in response, a DC voltage (DCSETP) is provided (step 204). In this step, the control unit 150 can receive an instruction to have the RF generator 10 provide a specific RF output power. This desired RF output power is referred to as the power setpoint (PSETP). The power setpoint can be received from another system (e.g., a semiconductor processing system), a user input, or any other source. In response to the requested power setpoint, the control unit 150 can instruct the DC source 140 to provide a DC voltage (DC setpoint (DCSETP)) likely to result in the desired power setpoint. The control unit 150 can be programmed in advance to instruct certain DC setpoints in response to certain received power setpoints. For example, a table of power setpoints can be provided along with corresponding DC setpoints.

Next, the control unit 150 calculates the power dissipated by the RF amplifier 100 (PDISS), and stores this value (Old PDISS) (step 206). As stated above, the power dissipated (PDISS) can be calculated as follows:

$$P_{dissipated} = P_{RF\ output} - P_{reflected} - P_{DC\ input}$$

By sensor 160 and the RF output parameters measured, the control unit 150 can determine the RF output power ($P_{RF\ output}$) and the power reflected ($P_{reflected}$). In the exemplified embodiment, the sensor 160 is a power sensor that measures voltage, current, and the phase angle between them at the RF output 120. In alternative embodiments, the power sensor can be a directional coupler that couples signals representative of forward and reflected power from the main power path, or can be another type of sensor. By sensor 170 and the DC input parameters measured, the control unit 150 can determine the power at the DC input 130. Using this information, the control unit 150 can determine the power dissipated by the RF amplifier 100 ($P_{dissipated}$ or PDISS). The control unit 150 can then store this value (Old PDISS) in memory (not shown) for future use.

Next, the process determines whether the control algorithm (CALG) is turned ON (step 208). The control algorithm can be controlled by the user at the control unit 150 by a switch or by any other known method for enabling an algorithm. In alternative embodiments, the control algorithm can always be ON when the DC source 140 is turned ON.

If the control algorithm is not turned ON, then the DC source 140 will simply provide the DC voltage of the DC setpoint, as discussed above.

Next, the process determines whether the RF generator 10 can make the predetermined power setpoint (PSETP) (step 210). This step can be carried out by the sensor 160 determining the RF output parameter and communicating this parameter to the control unit 150. The control unit 150 can then be programmed to determine the RF output power and whether it corresponds with the power setpoint. As used in this step, the term "make" refers to whether the RF output power can equal the power setpoint. The term make can also refer to exceeding the power setpoint, though such an occurrence is unlikely in such a system.

If the RF generator 10 can make the PSETP, the process next determines whether the maximum efficiency option (MAXEFF) has been turned ON (step 212). If the maximum efficiency option (a further capability of the control algorithm) is not turned ON, then the process will determine whether the PDAC is greater than or equal to the PDACL (step 214). The PDAC, discussed above, is sent by the control unit 150 to the RF source 105 and helps control how hard the RF amplifier 100 is working to produce the desired RF output power. The PDACL is a predetermined limit on how hard the RF amplifier 100 can be pushed.

If the PDAC has exceeded the PDACL, the process increases the DC voltage by a predetermined amount (DC-STEP) (step 216). This can be carried out by the control unit 150 sending such instructions to the DC source 140. The increase of the DC voltage helps to ease the burden on the RF amplifier 100, thereby decreasing the PDAC. The process then again determines whether the generator 10 can make the power setpoint (step 210) and again determines whether the PDAC is greater than or equal to PDACL (step 214). This process repeats until the PDAC is less than the PDACL. In alternative embodiments, the process can stop when the PDAC is less than or equal to the PDACL.

Once the PDAC is less than the PDACL, the process goes to point A, which requires determination of whether the power setpoint (PSETP) changed (step 218). The power setpoint can change for a variety of reasons. For example, in a system 5 for the plasma processing of semiconductors, the system 5 will require different RF output powers at different stages of the processing. If the power setpoint has changed, the process returns to step 204. If not, the process returns to step 208.

Returning to the maximum efficiency option (MAXEFF), if this option is set to ON, the process again calculates and stores the power dissipation at the RF amplifier 100 (PDISS) (step 220). This calculation is carried out in a manner similar to that discussed with regard to step 206.

The process then determines whether the New PDISS (calculated in step 220) is less than the Old PDISS (calculated in step 206) (step 222) at the current voltage. The current voltage is sometimes referred to as the "intermediate voltage" if it is a voltage different from the initial voltage (DCSETP) and the final voltage. This step can be carried out by the control unit 150. Several factors can cause the PDISS to change, such as a change to the load. If the New PDISS is less than the Old PDISS, then the power dissipation is increasing, and therefore the efficiency of the RF generator 10 is decreasing.

If it is determined that the New PDISS is not less than the Old PDISS (the New PDISS is greater than or equal to the Old PDISS), and therefore the PDISS is increasing, the process stops changing the DC voltage and becomes the final voltage. This step of the exemplified embodiment can enable the power dissipation to be a substantially minimum power dissipation (and therefore maximum efficiency) at which the output power is equal to the predetermined power setpoint.

The process then returns to point A and step 218 of the process (step 224). At those points in the exemplified embodiment when the process stops changing the DC voltage and returns to point A, the voltage is considered set at the final voltage. The final voltage is final in the sense that it is the DC voltage at which the DC source 140 remains until the power setpoint (PSETP) or some other factor changes prompting a reassessment of the DC voltage and its effects, as occurs in step 218. The term "final" does not mean that the voltage is permanent or cannot change. Note further that when the process determines whether a value is "less than" or "greater than" another value, in alternative embodiments this determination can be replaced with a determination of whether a value is "less than or equal to" or "greater than or equal to," respectively. Similarly, in alternative embodiments, "less than or equal to" and "greater than or equal to," can be replaced with "less than" and "greater than," respectively.

If it is determined that the New PDISS is less than the Old PDISS, the process determines whether the DC voltage is at its minimum (DCMIN) (step 226). If it is, then the process stops changing the DC voltage and returns to point A and step 218 of the process (step 228).

If the DC voltage is not at its minimum (DCMIN), the process determines whether the DC voltage was increased at its most recent change (230). The control unit 150 can carry out this determination, where previous changes to the DC voltage are stored in a memory (not shown) connected to or part of the control unit 150.

If it is determined that the DC voltage was increased at its most recent change (230), then the process stops changing the DC voltage and returns to point A and step 218 of the process (step 232). If it is determined that the DC voltage was not increased at its most recent change (230), then the DC voltage is decreased by DCSTEP (step 234). The process then returns to step 202 and determining whether the RF generator 10 can make the power setpoint at this newly decreased DC voltage. These steps of the exemplified embodiment enable the process to determine a substantially minimum DC voltage at which the output power is equal to the predetermined power setpoint.

If the RF generator 10 cannot make the power setpoint (PSETP), the process determines whether the RF amplifier's protection schemes have been enabled (step 236). For example, a protection scheme can limit the voltage on the drain of a field-effect transistor (FET) in the generator 10. The voltage on the FET drain can be measured. If the measured drain voltage exceeds a predetermined value, the protection scheme can lower the RF output power to lower the drain voltage. This can prevent the generator 10 from failing, but can also reduce the RF output power below the requested power setpoint.

If it is determined that the RF amplifier's protection schemes have been enabled, the process proceeds to step 226 and determines whether the DC voltage is at DC minimum. If it is determined that the RF amplifier's protection schemes have not been enabled, the process determines whether the PDAC is at its limit (PDACL), similar to step 214 (step 238). If it is not, the process returns to point A and step 218 of the process.

If the PDAC is at its limit, the process determines whether the DC voltage is at its maximum (DCMAX) (step 240). If it is, then the process stops changing the DC voltage and returns to point A and step 218 of the process (step 242). If the PDAC is not at its limit, the process increases the DC voltage by DCSTEP (step 244) and then returns to step 210 to determine whether the RF generator 10 can still make the power setpoint.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. An RF generator comprising:
   an RF amplifier comprising an RF input, a DC input, and an RF output, the RF amplifier configured to:
   receive at the RF input an RF signal from an RF source;
   receive at the DC input a DC voltage from a DC source; and
   provide an output power at the RF output; and
   a control unit operably coupled to the DC source and the RF source, the control unit configured to:
   receive a power setpoint indicative of a desired output power at the RF output;
   determine a power dissipation at the RF generator; and
   alter the DC voltage to a final DC voltage that decreases the power dissipation at the RF generator while enabling the output power at the RF output to be substantially equal to the power setpoint.

2. The RF generator of claim 1 wherein the control unit is further configured to alter the RF signal.

3. The RF generator of claim 1 wherein the final DC voltage (a) cannot be less than a predetermined minimum DC voltage value and (b) cannot exceed a predetermined maximum DC voltage value.

4. The RF generator of claim 1 wherein the determination of the final DC voltage includes a determination that, at an intermediate DC voltage, the power dissipation is increasing.

5. The RF generator of claim 4 wherein the altering of the DC voltage comprises one of (i) reducing the DC voltage by a predetermined amount and (ii) increasing the DC voltage by the predetermined amount.

6. The RF generator of claim 1 wherein the final DC voltage is substantially a minimum DC voltage at which the output power is substantially equal to the power setpoint.

7. The RF generator of claim 1 wherein the decreased power dissipation is substantially a minimum power dissipation at which the output power is substantially equal to the power setpoint.

8. The RF generator of claim 7 wherein the power dissipation is the power at the RF output minus a power at the DC input and a power reflected back to the RF amplifier.

9. The RF generator of claim 1 wherein the power setpoint is received from a semiconductor processing system.

10. A method of controlling an RF generator, the method comprising:
    a) providing an RF amplifier, the RF amplifier comprising a DC input, an RF input, and an RF output, the RF amplifier configured to provide an output power at the RF output;
    b) receiving an RF signal to the RF input of the RF amplifier;
    c) receiving a DC voltage to the DC input of the RF amplifier;
    d) receiving a power setpoint indicative of a desired output power at the RF output;
    e) determining a power dissipation at the RF generator; and
    f) altering the DC voltage to a final DC voltage that decreases the power dissipation at the RF generator while enabling the output power at the RF output to be substantially equal to the power setpoint.

11. The method of claim 10 wherein the control unit is further configured to alter the RF signal.

12. The method of claim 11 wherein the final DC voltage (a) cannot be less than a predetermined minimum DC voltage value and (b) cannot exceed a predetermined maximum DC voltage value.

13. The method of claim 10 wherein the determination of the final DC voltage includes a determination that, at an intermediate DC voltage, the power dissipation is increasing.

14. The method of claim 10 wherein the altering of the DC voltage comprises one of (i) reducing the DC voltage by a predetermined amount and (ii) increasing the DC voltage by the predetermined amount.

15. The method of claim 10 wherein the final DC voltage is substantially a minimum DC voltage at which the output power is substantially equal to the power setpoint.

16. The method of claim 10 wherein the decreased power dissipation is substantially a minimum power dissipation at which the output power is substantially equal to the power setpoint.

17. The method of claim 16 wherein the power dissipation is the power at the RF output minus a power at the DC input and a power reflected back to the RF amplifier.

18. The method of claim 10 wherein the power setpoint is received from a semiconductor processing system.

19. A method of fabricating a semiconductor comprising:
    placing a substrate in a plasma chamber configured to deposit a material layer onto the substrate or etch a material layer from the substrate; and
    energizing plasma within the plasma chamber by coupling RF power from an RF source into the plasma chamber to perform a deposition or etching;
    wherein the RF power is provided by an RF generator, the RF generator controlled by:
    a) providing an RF amplifier, the RF amplifier comprising a DC input, an RF input, and an RF output, the RF amplifier configured to provide an output power at the RF output;
    b) providing an RF signal to the RF input of the RF amplifier;
    c) providing a DC voltage to the DC input of the RF amplifier;
    d) receiving a power setpoint indicative of a desired output power at the RF output;
    e) determining a power dissipation at the RF generator; and
    f) altering the DC voltage to a final DC voltage that decreases the power dissipation at the RF generator while enabling the output power at the RF output to be substantially equal to the power setpoint.

20. The method of claim 19 wherein:
    the final DC voltage cannot be less than a predetermined minimum DC voltage value;
    the final DC voltage cannot exceed a predetermined maximum DC voltage value;

the determination of the final DC voltage includes a determination that, at an intermediate DC voltage, the power dissipation is increasing;

the altering of the DC voltage comprises one of (i) reducing the DC voltage by a predetermined amount and (ii) increasing the DC voltage by the predetermined amount; and the decreased power dissipation is substantially a minimum power dissipation at which the output power is substantially equal to the power setpoint.

* * * * *